(12) United States Patent
Weber (10) Patent No.: US 9,506,629 B2
(45) Date of Patent: Nov. 29, 2016

(54) METHODS AND APPARATUS FOR PROVIDING HOLES THROUGH PORTIONS OF A HOUSING OF AN ELECTRONIC DEVICE

(71) Applicant: Apple Inc., Cupertino, CA (US)

(72) Inventor: Douglas Joseph Weber, Arcadia, CA (US)

(73) Assignee: Apple Inc., Cupertino, CA (US)

( * ) Notice: Subject to any disclaimer, the term of this patent is extended or adjusted under 35 U.S.C. 154(b) by 369 days.

(21) Appl. No.: 14/025,618

(22) Filed: Sep. 12, 2013

(65) Prior Publication Data

US 2014/0016303 A1  Jan. 16, 2014

Related U.S. Application Data

(63) Continuation of application No. 12/235,857, filed on Sep. 23, 2008, now Pat. No. 8,564,961.

(60) Provisional application No. 61/025,531, filed on Feb. 1, 2008, provisional application No. 61/004,848, filed on Nov. 30, 2007.

(51) Int. Cl.
| | |
|---|---|
| *H05K 5/00* | (2006.01) |
| *F21V 15/01* | (2006.01) |
| *H05K 5/02* | (2006.01) |
| *F21V 33/00* | (2006.01) |
| *B29C 47/00* | (2006.01) |
| *B29C 47/12* | (2006.01) |
| *B29K 709/02* | (2006.01) |
| *B29L 22/00* | (2006.01) |
| *B29L 31/30* | (2006.01) |
| *B29L 31/60* | (2006.01) |
| *B29L 31/00* | (2006.01) |

(52) U.S. Cl.
CPC ........... *F21V 15/01* (2013.01); *F21V 33/0052* (2013.01); *H05K 5/0243* (2013.01); *B29C 47/00* (2013.01); *B29C 47/0028* (2013.01); *B29C 47/12* (2013.01); *B29C 2793/009* (2013.01); *B29C 2793/0018* (2013.01); *B29K 2709/02* (2013.01); *B29L 2022/00* (2013.01); *B29L 2031/3061* (2013.01); *B29L 2031/60* (2013.01); *B29L 2031/722* (2013.01); *Y10T 307/826* (2015.04)

(58) Field of Classification Search
CPC ........ H01H 9/00; G01N 21/62; G01N 21/64; G01N 21/65; G06K 7/10; F41J 5/02
USPC ................. 361/752, 728; 235/462.2, 462.21, 235/462.43; 455/550.1; 213/317; 200/314; 250/221, 222.1; 256/301
See application file for complete search history.

(56) References Cited

U.S. PATENT DOCUMENTS

| | | | | |
|---|---|---|---|---|
| 3,478,220 | A | * 11/1969 | Milroy | G01V 8/20 250/221 |
| 3,621,934 | A | 11/1971 | Thrasher et al. | |
| 3,727,069 | A | * 4/1973 | Crittenden, Jr. | F41J 5/02 250/206.2 |
| 4,267,443 | A | * 5/1981 | Carroll | G01V 8/20 250/221 |
| 4,384,201 | A | * 5/1983 | Carroll | G01V 8/20 250/221 |
| 4,404,865 | A | 9/1983 | Kim | |
| 4,622,444 | A | 11/1986 | Kandatsu et al. | |
| 4,739,160 | A | * 4/1988 | Kawabe | G06F 3/0421 250/221 |
| 4,763,903 | A | * 8/1988 | Goodwin | F41J 5/02 250/222.1 |

(Continued)

*Primary Examiner* — Xiaoliang Chen
(74) *Attorney, Agent, or Firm* — Downey Brand LLP (57) ABSTRACT

Electronic devices are provided with housing components that have improved aesthetics. One or more holes may be formed through an extruded portion of the housing.

20 Claims, 8 Drawing Sheets

(56) References Cited

U.S. PATENT DOCUMENTS

| | | | |
|---|---|---|---|
| 4,787,737 A * | 11/1988 | Ogawa | H04N 5/7441 348/E5.141 |
| 4,820,200 A | 4/1989 | Lau | |
| 5,419,865 A | 5/1995 | Ogata et al. | |
| 5,591,659 A | 1/1997 | Ema et al. | |
| 5,830,529 A | 11/1998 | Ross | |
| 6,037,103 A | 3/2000 | Hino | |
| 6,078,380 A | 6/2000 | Taniguchi et al. | |
| 6,392,549 B1 | 5/2002 | Wu | |
| 6,578,767 B1 * | 6/2003 | Barkan | G06K 7/10772 235/462.2 |
| 6,753,253 B1 | 6/2004 | Takahashi et al. | |
| 6,761,317 B1 * | 7/2004 | Knowles | G06K 7/10 235/375 |
| 6,930,332 B2 | 8/2005 | Hashimoto et al. | |
| 8,047,696 B2 | 11/2011 | Ijzerman et al. | |
| 2002/0028693 A1 | 3/2002 | Johnson | |
| 2002/0057360 A1 | 5/2002 | Abe et al. | |
| 2002/0105640 A1 * | 8/2002 | Deck | G01N 21/65 356/301 |
| 2002/0122302 A1 | 9/2002 | Palmer | |
| 2002/0142795 A1 * | 10/2002 | Imahori | H04M 1/035 455/550.1 |
| 2002/0148410 A1 * | 10/2002 | Thomas | A01K 1/0245 119/452 |
| 2002/0148677 A1 | 10/2002 | Chang | |
| 2004/0054386 A1 | 3/2004 | Martin et al. | |
| 2004/0104460 A1 | 6/2004 | Stark | |
| 2004/0203414 A1 | 10/2004 | Satou et al. | |
| 2005/0057685 A1 | 3/2005 | Yamaguchi | |
| 2005/0174499 A1 * | 8/2005 | Clark | G02B 6/0088 349/16 |
| 2005/0179813 A1 * | 8/2005 | Fujii | H04N 5/2252 348/375 |
| 2006/0018041 A1 | 1/2006 | Hirata | |
| 2006/0268528 A1 | 11/2006 | Zadesky et al. | |
| 2007/0103453 A1 * | 5/2007 | Choo | G06F 3/03547 345/173 |
| 2007/0193867 A1 * | 8/2007 | Lorenzo Riera | H01H 13/023 200/314 |
| 2007/0242453 A1 * | 10/2007 | Suzuki | G03B 21/145 362/218 |
| 2007/0278078 A1 * | 12/2007 | Mishima | H01H 13/023 200/344 |
| 2008/0024470 A1 | 1/2008 | Andre et al. | |
| 2008/0060148 A1 | 3/2008 | Pinyayev et al. | |
| 2008/0084401 A1 * | 4/2008 | Joo | H04M 1/22 345/173 |
| 2008/0084404 A1 | 4/2008 | Andre et al. | |
| 2008/0090618 A1 | 4/2008 | Lim et al. | |
| 2008/0106911 A1 * | 5/2008 | Park | G02B 6/0085 362/612 |
| 2008/0123337 A1 | 5/2008 | Higashi et al. | |
| 2008/0128596 A1 | 6/2008 | Liu et al. | |
| 2008/0151360 A1 | 6/2008 | Stipe | |
| 2008/0163663 A1 * | 7/2008 | Hankey | B21C 23/18 72/348 |
| 2008/0164770 A1 | 7/2008 | Terlizzi | |
| 2008/0165064 A1 | 7/2008 | Hill et al. | |
| 2008/0165485 A1 | 7/2008 | Zadesky et al. | |
| 2008/0166001 A1 | 7/2008 | Hankey et al. | |
| 2008/0166005 A1 * | 7/2008 | Terlizzi | H04R 1/083 381/375 |
| 2008/0166007 A1 | 7/2008 | Hankey et al. | |
| 2008/0253123 A1 * | 10/2008 | Miyasu | G03B 21/2086 362/285 |
| 2008/0285041 A1 | 11/2008 | Ocelic et al. | |
| 2009/0103704 A1 | 4/2009 | Kitada et al. | |
| 2009/0173506 A1 | 7/2009 | Yoshida | |

* cited by examiner

METHODS AND APPARATUS FOR PROVIDING HOLES THROUGH PORTIONS OF A HOUSING OF AN ELECTRONIC DEVICE

CROSS-REFERENCE TO RELATED APPLICATIONS

This is a continuation of U.S. application Ser. No. 12/235,857 filed Sep. 23, 2008, which claims the benefit of U.S. Provisional Patent Application No. 61/004,848, filed Nov. 30, 2007, and U.S. Provisional Patent Application No. 61/025,531, filed Feb. 1, 2008, each of which is hereby incorporated by reference herein in its entirety.

FIELD OF THE INVENTION

This relates to methods and apparatus for providing holes through housing components and other external surfaces of electronic devices.

BACKGROUND OF THE DISCLOSURE

There is a need for constructing holes through housing components and other external surfaces of various electronic devices. Specifically, there is a need for improving the aesthetics, size, and ease of manufacture of such holes.

Some known electronic devices (e.g., computers and telephones) include at least one internal electronic component associated with the operation of the device and a protective housing that at least partially encloses the internal electronic component. Typically, the housing includes one or more housing components that serve to at least partially surround the internal electronic components at a peripheral region of the electronic device so as to cover and protect the internal components from adverse conditions. Also, one or more holes may be provided through one or more of the housing components. Information transmitted from and/or received by the internal electronic components may be passed through the one or more holes provided through the housing component of the electronic device. Some known housing components include openings that at least partially expose external surfaces of internal electronic components. One or more holes may also be provided through exposed external surfaces of electronic components.

Cosmetic features are important to consumers of electronic devices, as these features help create the overall impression that one has of the electronic device. Therefore, the housing components, other external surfaces, and the holes provided therethrough, may also be configured to form and aesthetically enhance the outward appearance of the electronic device. For example, the shape, contours, and/or color of the housing and/or the holes provided through the housing may be designed so as to create a positive impression about the electronic device, thereby contributing to the overall success of the device in the market place.

Accordingly, what is needed are apparatus and methods for providing holes through housing components and other external surfaces of electronic devices that are aesthetically pleasing, small, and easy to manufacture.

SUMMARY OF THE DISCLOSURE

Apparatus and methods for providing holes through housing components and other external surfaces of electronic devices that are aesthetically pleasing, small, and easy to manufacture are provided.

According to one embodiment of the invention, there is provided a method of forming an external surface portion of an electronic device. The method may include extruding a block of material longitudinally for creating at least one hole through the material and assembling the external surface portion using at least a portion of the extruded block that has at least a portion of the at least one hole therethrough. The at least a portion of the at least one hole may provide at least one passageway for information to be communicated through the extruded block.

According to another embodiment of the invention, there is provided an electronic device including an extruded external surface portion that may include an inner surface, an outer surface, and at least one hole formed between the inner surface and the outer surface. The electronic device may also include an input/output interface component adjacent the inner surface. The at least one hole may provide at least one passageway for information to be communicated through the extruded external surface portion between the interface component and an environment adjacent the outer surface.

According to another embodiment of the invention, there is provided an electronic device including a housing component that may include an inner surface, an outer surface, and at least one hole extruded between the inner surface and the outer surface. The electronic device may also include an input/output interface component, wherein the at least one hole provides at least one passageway for information to be communicated through the housing component between the interface component and an environment adjacent the outer surface.

BRIEF DESCRIPTION OF THE DRAWINGS

The above and other features of the invention, its nature, and various advantages will become more apparent upon consideration of the following detailed description, taken in conjunction with the accompanying drawings, in which like reference characters refer to like parts throughout, and in which.

DETAILED DESCRIPTION OF THE DISCLOSURE

Apparatus and methods are provided for providing holes through housing components and other external surfaces of electronic devices that are aesthetically pleasing, small, and easy to manufacture. The invention will now be described with reference to FIGS. 1-9.

FIGS. 1-4 show an embodiment of electronic device 100 including at least one external surface portion constructed in accordance with the invention. The term "electronic device" can include, but is not limited to, music players, video players, still image players, game players, other media players, music recorders, video recorders, cameras, other media recorders, radios, medical equipment, domestic appliances, transportation vehicle instruments, calculators, cellular telephones, other wireless communication devices, personal digital assistants, programmable remote controls, pagers, laptop computers, desktop computers, printers, and combinations thereof. In some cases, the electronic devices may perform a single function (e.g., a device dedicated to playing music) and, in other cases, the electronic devices may perform multiple functions (e.g., a device that plays music, displays video, stores pictures, and receives and transmits telephone calls).

Moreover, in some cases, these electronic devices may be any portable, mobile, hand-held, or miniature electronic device having at least one external surface portion constructed in accordance with the invention so as to allow a user to use the device wherever the user travels. Miniature electronic devices may have a form factor that is smaller than that of hand-held electronic devices, such as an iPod™ available by Apple Inc. of Cupertino, Calif. Illustrative miniature electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, and combinations thereof. Alternatively, electronic devices that include an external surface portion constructed in accordance with the invention may not be portable at all, but may instead be generally stationary, such as a television or a desktop computer (e.g., an iMac™ available by Apple Inc.).

Figure 1:
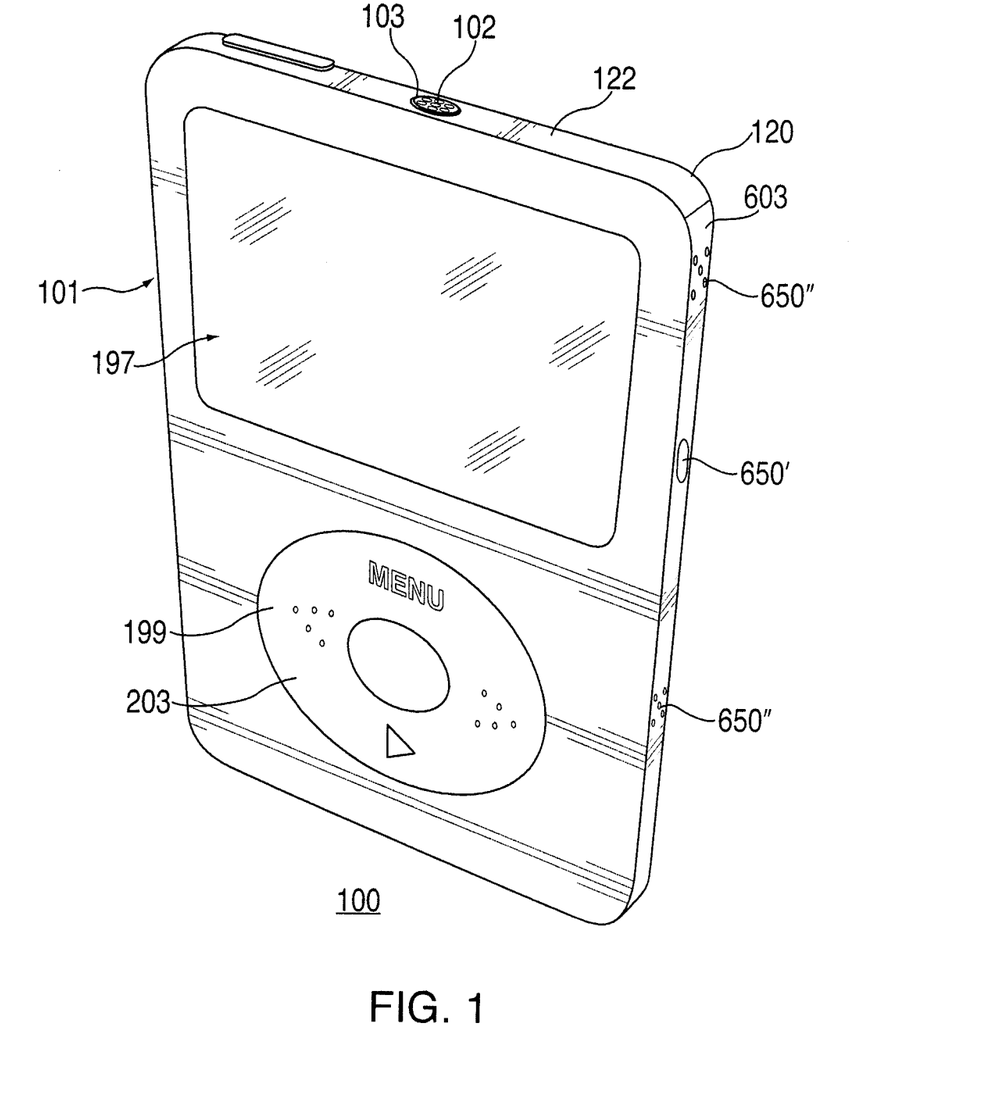
FIG. 1 is a top, front, right perspective view of an electronic device in accordance with some embodiments of the invention.

Electronic device 100 can include at least one electronic component (e.g., a processor, memory region, display component, transmitter, receiver, etc.) and a protective housing (e.g., housing 101) that at least partially encloses the one or more electronic components of the device. As shown in FIG. 1, for example, housing 101 of device 100 may at least partially enclose a device output component 197 (e.g., a video display screen) and a user input component 199 (e.g., a scroll wheel). Moreover, as shown in FIG. 1, housing 101 can be hexahedral. Although, it should be noted that housing 101 of device 100 is only exemplary and need not be substantially hexahedral, and that, in certain embodiments, the housing of device 100 could generally be formed in any other suitable shape, including, but not limited to, substantially spherical, ellipsoidal, conoidal, octahedral, or a combination thereof, for example.

In some embodiments, housing 101 may include one or more housing components. Each of the housing components may be made from the same type of material or from various different types of materials including, but not limited to, metal (e.g., aluminum, titanium, steel, copper, etc.), plastic (e.g., polycarbonate, ABS, nylon, etc.), ceramic (e.g., alumina, zirconia, etc.), or combinations thereof, such as that described in Zadesky et al., U.S. Published Patent Application No. 2006/0268528, published Nov. 30, 2006, and Zadesky et al., U.S. Published Patent Application No. 2008/0165485, published Jul. 10, 2008, each of which is hereby incorporated by reference herein in its entirety. Each housing component may be coupled to another housing component in various ways including, but not limited to, adhesives, screws, snap-fits, welding, integrally, and the like.

In some embodiments, housing 101 may include at least one housing component formed from metal. The metal housing component may be configured to make the electronic device look as if the electronic device was formed from a single block of metal (i.e., a solid piece of metal that has been hollowed out).

In other embodiments, however, housing 101 may not be formed from a block of material, as the cost of doing this can be quite expensive. That is, although the housing component may look as though it was machined to give it its net shape from a single block of material, it may in fact be formed by other processes designed to mimic the machined look.

In some embodiments, a metal housing component that looks like it was formed from a block of material may be formed rather from a piece of sheet of metal (e.g., flat stock). That is, the sheet metal may be formed in such a way that the final part looks like it was machined down from a large thick slab of material. By utilizing sheet metal, the overall cost of the part can be reduced (e.g., it is very expensive to machine down a large piece of metal as it wastes a lot of material and time).

In some embodiments, the shape of the housing component may be at least partially created by drawing and, more particularly, by deep drawing portions of the sheet of metal. Additionally or alternatively, the shape of the housing component may be at least partially created by forging portions of the sheet of metal. Additionally or alternatively, the shape of the housing component may be at least partially created by machining portions of the sheet of metal. For example, a sheet of metal may be deep drawn to form a housing component with a front wall and side walls extending therefrom (e.g., to form a box or can with one open end). The housing component may be configured with a front wall and top, right side, left side, and bottom walls at the peripheral edge portions of the front wall. The front wall as well as the other walls may include various openings for exposing external surfaces of input/output ("I/O") components associated with the electronic device. For example, the front wall may include a large opening for exposing an external portion of a display of the electronic device (e.g., device output component 197) and another opening for exposing an external portion of a scroll wheel of the electronic device (e.g., user input component 199). Thereafter, portions of the housing component may be forged to affect its geometry at specific locations (e.g., to change the shape and/or thickness of the material at specific locations). Thereafter, portions of the housing component may be machined to form a near net shape.

Any portion or the entirety of any housing component or any portion of any external surface of an electronic device may include one or more holes formed therethrough for providing an I/O interface, such as that described in Andre et al., U.S. Published Patent Application No. 2008/0084404, published Apr. 10, 2008, and Andre et al., U.S. Published Patent Application No. 2008/0024470, published Jan. 31, 2008, each of which is hereby incorporated by reference herein in its entirety.

Alternatively or additionally, in accordance with the invention, any portion of or the entirety of any housing component and/or any portion of any electronic component exposed by an opening in a housing component may be extruded to provide one or more small holes therethrough according to the invention. For example, in some embodiments, such holes may provide passageways for information to be communicated through the extruded portion to and/or from one or more electronic components disposed within the housing of the device (e.g., an I/O interface component). An I/O component may be positioned adjacent the inner surface of an extruded portion of a housing component and under one or more of the extruded holes, thereby creating an I/O interface. Alternatively, one or more holes may be provided through an external portion of an I/O component itself, thereby creating an I/O interface. Such holes may be extruded to create passageways for various types of information for various I/O components, including, but not limited to, sound to a microphone or from a speaker, light to a light sensor or from a visual indicator, and the like. Additionally or alternatively, such holes may be extruded to give a user of the device access to various features or components internal to electronic device 100, such as buttons, switches, connectors, and the like.

For example, as shown in FIGS. 1-4, an external portion 103 of electronic device 100 may be extruded to provide one or more holes 150 therethrough. Although extruded portion 103 is described with respect to FIGS. 1-4 as an external portion provided in a cavity along a top wall of housing component 120 of housing 101, it is to be understood that extruded portion 103 may be any portion of or the entirety of any housing component of electronic device 100. Alternatively, extruded portion 103 may be any other external portion of electronic device 100 (e.g., an outer surface portion of a click wheel or any other I/O component) in accordance with the invention. For example, an extruded portion of the invention, such as extruded portion 103, may be provided as an entire wall or as multiple walls of a housing of electronic device 100.

Figure 2:
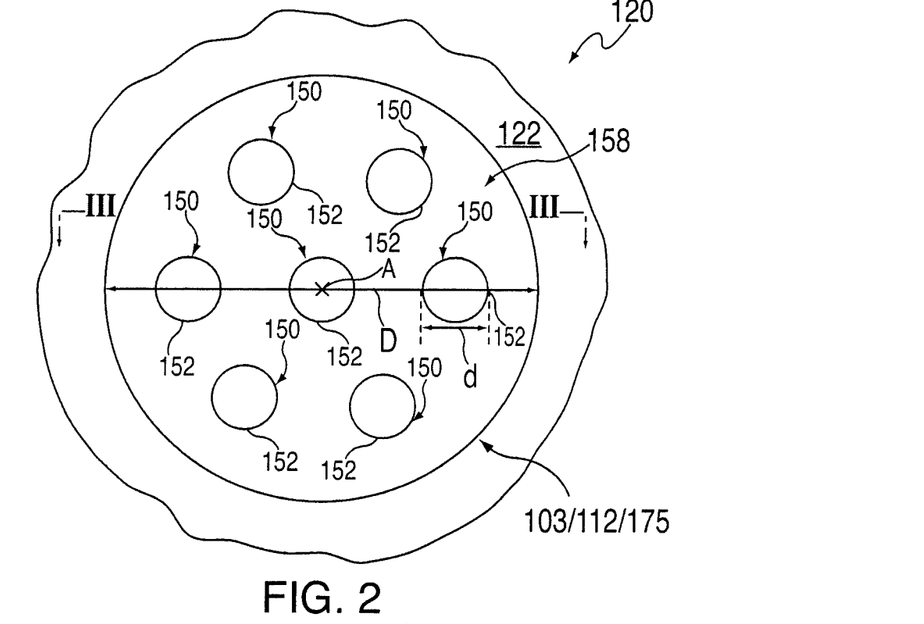
FIG. 2 is a top elevational view of a portion of the electronic device of FIG. 1.
Figure 3:
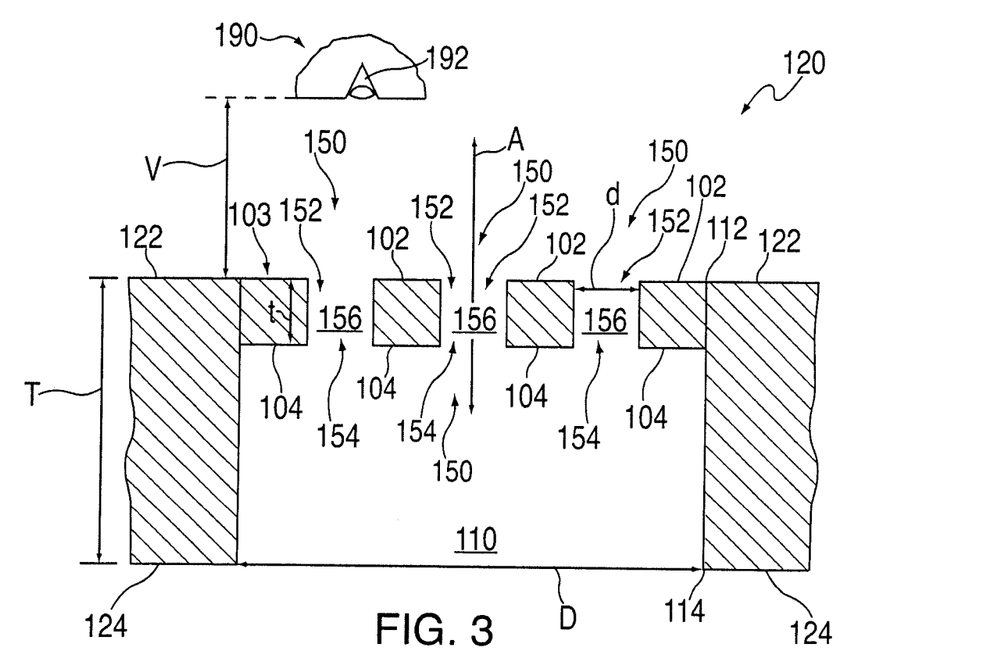
FIG. 3 is a cross-sectional view of a portion of the electronic device of FIGS. 1 and 2, taken from line III-III of FIG. 2.
Figure 4:
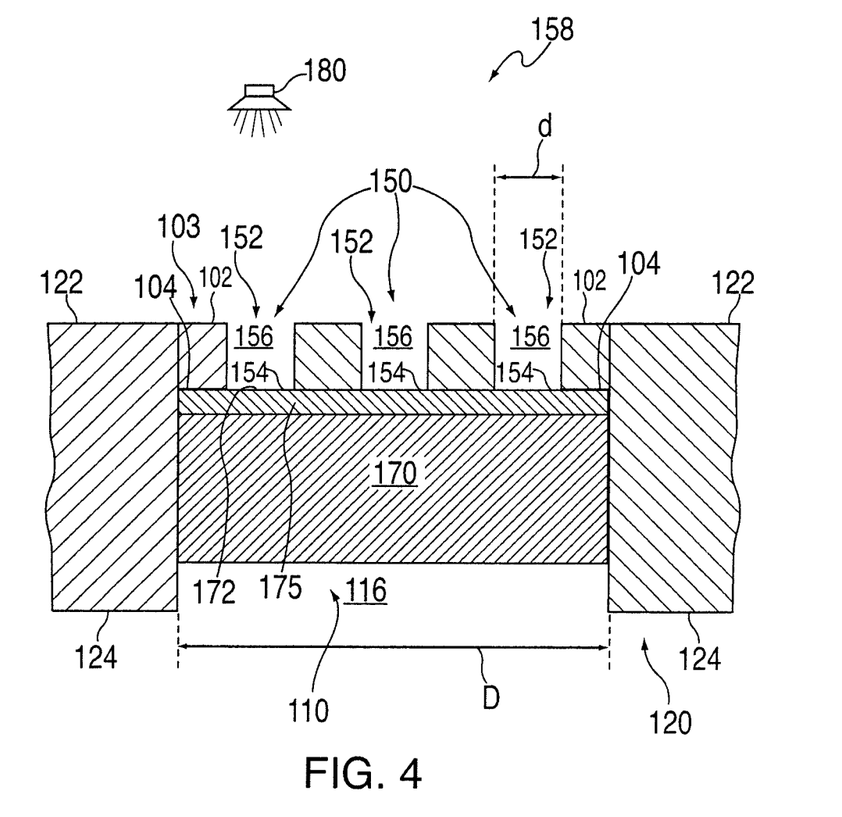
FIG. 4 is a cross-sectional view of a portion of the electronic device of FIGS. 1-3, similar to FIG. 3, but with an additional component, in accordance with some embodiments of the invention.

As shown in FIGS. 2-4, for example, a cavity 110 may be formed between a "cosmetic" or outer surface 122 and an opposite or "internal" or inner surface 124 of housing component 120 of housing 101. Cavity 110 may be defined by an outer opening 112 in outer surface 122 of housing component 120, an inner opening 114 in inner surface 124 of housing component 120, and a hollow passageway 116 extending therebetween. Cavity 110 may be formed through housing component 120 at the location where extruded portion 103 is to be provided. Cavity 110 may be formed by any suitable process, such as laser ablating, for example.

Similarly, each hole 150 may be provided between a "cosmetic" or outer surface 102 and an opposite or "internal" or inner surface 104 of extruded portion 103. Two or more holes 150 may form a collection or pattern 158 of neighboring holes 150 on outer surface 102 of extruded portion 103. Each hole 150 may be defined by an outer opening 152 in outer surface 102 of extruded portion 103, an inner opening 154 in inner surface 104 of extruded portion 103, and a hollow passageway 156 extending therebetween. Portion 103 may be formed by any suitable extrusion process, as described below in more detail, for example.

In some embodiments, one or more holes 150 may be formed by creating a hollow passageway in extruded portion 103 between an outer opening in outer surface 102 and an inner opening in inner surface 104 such that substantially all sides of the passageway are parallel with one another. Moreover, the sides of the passageway may also be parallel with an axis that is substantially perpendicular to outer surface 102, and, in some embodiments, substantially in the center of outer surface 102. For example, as shown in FIGS. 2 and 3, the walls of each of hollow passageways 156 in extruded portion 103 between outer opening 152 in outer surface 102 and inner opening 154 in inner surface 104 may be substantially parallel with an axis A that is substantially perpendicular to outer surface 102. In other embodiments, one or more holes may be formed by creating a tapered hollow passageway in portion 103 between outer surface 102 and inner surface 104 such that one or more side portions of the passageway are angled with respect to each other. Moreover, one or more side portions of the passageway may be angled with respect to an axis that is substantially perpendicular to outer surface 102 (e.g., axis A).

Although shown greatly enlarged in FIGS. 2-4, one or more of holes 150 may be imperceptible or invisible to the unaided human eye. That is, the cross-sectional area of outer opening 152 of one or more holes 150 may be too small to be resolvable by a user looking at outer surface 102 of extruded portion 103. The average limit of resolution for the unaided adult human eye is about 0.10 millimeters at a viewing distance of about 1 meter. For children, the average limit of resolution is somewhat finer (e.g., 0.04 millimeters at a viewing distance of about 1 meter). Therefore, depending on the anticipated viewer 190 and the anticipated viewing distance V between his or her eye 192 and outer surface 102 of extruded portion 103 (see, e.g., FIG. 3), the cross-sectional area of outer opening 152 of one or more holes 150 may be selected to be below the limit of resolution of user 190, thereby being imperceptible or invisible to user's eye 192 (see, e.g., FIG. 3).

For example, in some embodiments, the cross-sectional area of outer opening 152 of one or more holes 150 may be in the range of 175 square micrometers to 1600 square micrometers. In some embodiments, the cross-sectional area of outer opening 152 of one or more holes 150 may be in the range of 300 square micrometers to 1250 square micrometers. In some embodiments, the cross-sectional area of outer opening 152 of one or more holes 150 may be in the range of 500 square micrometers to 1000 square micrometers. In some embodiments, the cross-sectional area of outer opening 152 of one or more holes 150 may be about 750 square micrometers. In other embodiments, the cross-sectional area of outer opening 152 of one or more holes 150 may be much larger or much smaller. As a more specific example, if outer opening 152 is provided as a circular opening having a diameter d, as shown, diameter d of outer opening 152 of one or more holes 150 may be in the range of 15 micrometers to 45 micrometers. In some embodiments, the diameter d of outer opening 152 of one or more holes 150 may be in the range of 20 micrometers to 40 micrometers. In some embodiments, the diameter d of outer opening 152 of one or more holes 150 may be in the range of 25 micrometers to 35 micrometers. In some embodiments, the diameter d of outer opening 152 of one or more holes 150 may be about 30 micrometers. In other embodiments, the cross-sectional area of outer opening 152 of one or more holes 150 may be much larger or much smaller.

Thus, as defined herein, the term "invisible hole" and/or "micro hole" may refer to any hole with an outer opening that is smaller than what may be resolvable by an unaided human eye at an anticipated viewing distance. Conversely, it is to be understood that the terms "visible hole" and/or "macro hole," as defined herein, may refer to any hole with an outer opening that is large enough to be resolvable by an unaided human eye at an anticipated viewing distance.

Extruded portion 103 of electronic device 100 may be made of any suitable material that may be extruded and retain its structural integrity. For example, extruded portion 103 may be made of one or more various types of materials, such as metals, metal alloys, plastics, ceramics, and the like. By way of example, the metals may correspond to aluminum, titanium, steel, copper, etc., the plastic materials may correspond to polycarbonate, ABS, nylon, etc., and the ceramic materials may correspond to alumina, zirconia, etc., and combinations thereof.

Once formed, extruded portion 103 may be assembled into cavity 110 of housing component 120. In some embodiments, extruded portion 103 and cavity 110 may be formed such that, when assembled, outer surface 102 of extruded portion 103 fills outer opening 112 of cavity 110 and appears substantially continuous with outer surface 122 of housing component 120. Extruded portion 103 may be retained within cavity 110 in many various ways including, for example, an adhering substance or mechanical holding elements (not shown). Alternatively, extruded portion 103 and cavity 110 may be formed such that, when assembled, outer surface 102 of extruded portion 103 extends above or is recessed below outer opening 112 of cavity 110. In yet other embodiments, extruded portion 103 and cavity 110 may be formed such that, when assembled, inner surface 104 of extruded portion 103 fills outer opening 112 of cavity 110 and appears substantially on top of outer surface 122 of housing component 120. It is to be understood that extruded portion 103 may be assembled in any suitable way with respect to a cavity formed in any location of any component of any electronic device in accordance with the invention. In some embodiments, extruded portion 103 may be the entire housing 101 itself, depending on the needs of device 100.

Housing component 120 (or any other component of electronic device 100 that may be provided with an extruded portion, such as an external surface portion of a scroll wheel) may be provided with an overall thickness T between outer surface 122 and inner surface 124. In some embodiments, thickness T may be in the range of 0.5 millimeters to 5.5 millimeters. In some embodiments, thickness T may be in the range of 1.5 millimeters to 4.5 millimeters. In some embodiments, thickness T may be in the range of 2.5 millimeters to 3.5 millimeters. In some embodiments, thickness T may be about 3.0 millimeters. In other embodiments, thickness T may be in the range of 0.25 millimeters to 0.75 millimeters. In some embodiments, thickness T may be in the range of 0.35 millimeters to 0.65 millimeters. In some embodiments, thickness T may be in the range of 0.45 millimeters to 0.55 millimeters. In some embodiments, thickness T may be about 0.49 millimeters.

Extruded portion 103 may be provided with an overall thickness t between outer surface 102 and inner surface 104 that may be similar to thickness T of housing component 120. However, in some embodiments, as shown in FIG. 3, for example, extruded portion 103 may be provided with an overall thickness t between outer surface 102 and inner surface 104 that is smaller than thickness T of housing component 120. As shown in FIG. 3, for example, extruded portion 103 may have a reduced thickness t with respect to thickness T of housing component 120 such that a portion of cavity 110 may not contain extruded portion 103 (e.g., the portion of cavity 110 between inner surface 124 of housing component 120 and inner surface 104 of extruded portion 103). In some embodiments, thickness t may be in the range of 0.2 millimeters to 0.8 millimeters. In some embodiments, reduced thickness t may be in the range of 0.3 millimeters to 0.7 millimeters. In some embodiments, reduced thickness t may be in the range of 0.4 millimeters to 0.6 millimeters. In some embodiments, reduced thickness t may be about 0.5 millimeters. In other embodiments, reduced thickness t may be in the range of 0.05 millimeters to 0.45 millimeters. In some embodiments, reduced thickness t may be in the range of 0.15 millimeters to 0.35 millimeters. In some embodiments, reduced thickness t may be about 0.25 millimeters.

An I/O interface component may be provided adjacent the inner surface of the extruded portion under one or more holes provided therein for creating an I/O interface. As shown in FIG. 4, for example, an I/O component 170 may be provided adjacent inner surface 104 of extruded portion 103. In some embodiments, I/O component 170 may be positioned such that an outer surface 172 of I/O component 170 faces an inner opening 154 of one or more holes 150 in extruded portion 103. If the respective thicknesses t and T of extruded portion 103 and housing component 120 provide a vacant portion of cavity 110, that vacant portion of cavity 110 may be sized such that I/O component 170 fits therein. It is to be understood that extruded portion 103 may be a portion of an I/O component 170 in accordance with the invention. For example, extruded portion 103 may be an external surface portion of a scroll wheel I/O component 170.

I/O component 170 may be any component suitable for transmitting and/or receiving information through one or more holes 150 proximal thereto. A minimum aspect ratio of the total cross-sectional area of the openings of holes 150 formed through extruded portion 103 with respect to the total cross-sectional area or surface area of the active portion of I/O component 170 may be carefully designed to meet the performance specifications of that particular I/O component.

For example, in some embodiments, I/O component 170 may be a microphone that is capable of receiving sound waves transmitted from a source external to the housing component (e.g., external source 180) through one or more holes 150. The minimum aspect ratio of the combined total cross-sectional area of outer openings 152 of holes 150 with respect to the total surface area of the active portion of microphone I/O component 170 (e.g., the total surface area of the transducer or sensor used to receive sound waves) may be chosen to meet specific performance requirements of microphone 170. In some embodiments, this minimum aspect ratio may be in the range of 10% to 30%. In some embodiments, this minimum aspect ratio may be in the range of 15% to 25%. In some embodiments, this minimum aspect ratio may be about 18.4%.

As shown in FIG. 4, for example, I/O component 170 may include an active portion 175 that spans outer surface 172. Moreover, as shown in FIG. 4, active portion 175 and outer surface 172 of I/O component 170 may also span inner surface 104 of extruded portion 103. In this embodiment, in which holes 150 may be utilized to pass sound waves from external source 180 to I/O component 170 configured as a microphone, each hole 150 may be provided with a circular outer opening 152 having a diameter d (see, e.g., FIGS. 2-4), for example. Moreover, cavity 110 may be formed within housing component 120 as a cylinder having a diameter D (see, e.g., FIGS. 2-4) and, therefore, inner surface 104 of extruded portion 103 and active portion 175 of microphone 170 may also be cylindrical with a diameter D.

In this particular illustrative embodiment, seven equally shaped holes 150 have been provided through extruded portion 103 as pattern 158. Therefore, in order to meet specific performance specifications of microphone 170, the combined cross-sectional area of all seven holes 150 in pattern 158 must be at least a specifically chosen percentage of the surface area of active portion 175 (i.e., have a specifically chosen aspect ratio). For example, in some embodiments, if diameter D of active portion 175 is 1.5 millimeters and if the minimum required aspect ratio of microphone 170 is 18.4%, each of the seven holes 150 of pattern 158 may be formed with an outer opening 152 having a diameter d equal to about 0.25 millimeters.

In other embodiments, I/O component 170 may include one or more light sources capable of transmitting light through one or more holes 150 towards a user or other entity external to the housing component (e.g., viewer 190 of FIG. 3). Additionally or alternatively, I/O component 170 may include one or more receptors that may be sensitive to visible light received through one or more holes 150 from an entity external to the housing component for providing ambient light sensing ("ALS"), for example. I/O component 170 may include one or more receptors that may be sensitive to infra-red light ("IR") received through one or more holes 150 from an entity external to the housing component for receiving IR control signals from a remote control transmitter, for example. I/O component 170 may also be configured as an antenna, a proximity detector, a motion detector, or any other suitable I/O device that may transmit and/or receive information via one or more holes 150.

It is to be understood, that the foregoing is just illustrative, and that I/O component active portion 175, cavity 110, pattern 158, and each one of holes 150 and its openings 152 and 154 may be formed of any suitable size and shape, including, but not limited to, triangular, rectangular, elliptical, asymmetrical, etc. Moreover, pattern 158 may be formed of any suitable number of holes 150, including just one hole, for example. Each hole 150 in pattern 158 may be separated from other holes 150 in pattern 158 by any suitable distance, depending on the size of pattern 158 and the function of holes 150 with respect to an associated I/O component 170.

For example, in some embodiments, holes extruded through a portion of an electronic device may individually create or combine to create an image. As used herein, the word "image" may refer broadly to any visual form, representation, or depiction. An image may mean and include a logo, an icon, or any other graphic representation (e.g., words, numbers, letters, figures, symbols, etc.). For example, an extruded portion of the invention may be provided adjacent or as a part of an I/O component of an electronic device. The holes of the extruded portion may provide images in the form of icons associated with functions of the electronic device (e.g., recording and playback functions of a media player electronic device). The icons may include icons representing functions such as "pause," "play," "stop," "fast forward," "reverse," etc.

Figure 5:
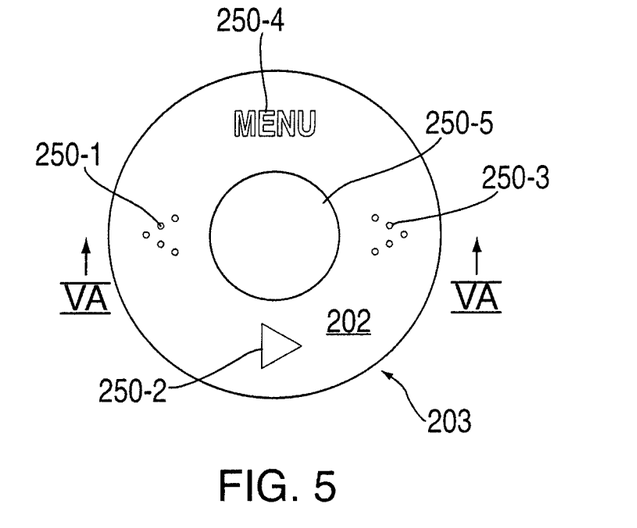
FIG. 5 is a top elevational view, similar to FIG. 2, of an extruded portion of an electronic device in accordance with some embodiments of the invention.
Figure 5A:
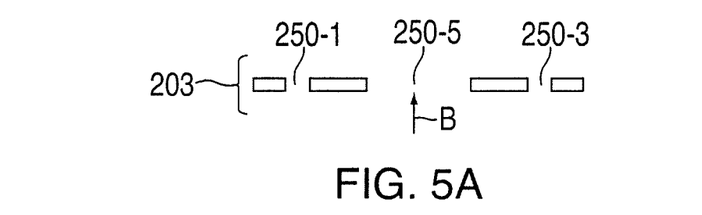
FIG. 5A is a cross-sectional view of the extruded portion of FIG. 5, taken from line VA-VA of FIG. 5, before a process in accordance with some embodiments of the invention.
Figure 5B:
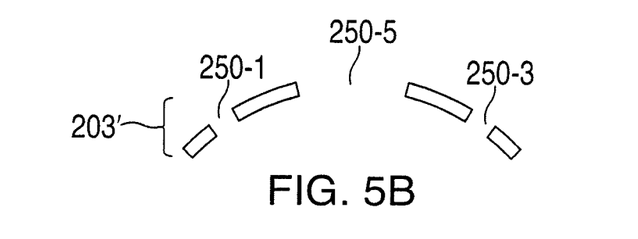
FIG. 5B is a cross-sectional view of the extruded portion of FIGS. 5 and 5A, similar to FIG. 5A, but after a process in accordance with some embodiments of the invention.

For example, as shown in FIG. 5, an extruded portion 203 similar to extruded portion 103 according to other embodiments of the invention may have an outer surface 202 that is circular. Extruded portion 203 may include various types of holes 250 of various shapes, sizes, and patterns provided for various purposes. For example, extruded portion 203 may include a plurality of holes, such as a set of small circular holes 250-1, that may form an image, such as the symbol "<". Extruded portion 203 may be provided as an external surface portion of a scroll wheel I/O component of an electronic device (see, e.g., FIG. 1) and the symbol "<" of holes 250-1 may represent a "reverse" function of the scroll wheel. Holes 250-1 may be "visible holes" so that the "<" may be resolvable by a user of the device. Alternatively or additionally, extruded portion 203 may include a large triangular hole 250-2, holes 250-3 that form a ">" image, holes 250-4 that form an image reading "MENU," and a circular hole 250-5, thereby completing scroll wheel user input device 199 of device 100 of FIG. 1, for example.

Each hole 150 or 250 may be formed through an extruded portion of an electronic device using one or more suitable extrusion techniques. Generally, extrusion is a shaping process where a continuous work piece is produced by forcing material (e.g., molten or hot material) through a shaped orifice, such that the extrusion process may produce a length of a particular cross-sectional shape. The cross-sectional length or shape of the continuous work piece may be controlled at least in part on the shaped orifice. As the shaped work piece exits the orifice, it may be cooled and thereafter cut to a desired length. An extrusion process may be a continuous high volume process that can produce intricate profiles and that can accurately control work piece dimensions, such as that described in Zadesky et al., U.S. Pat. No. 7,724,532, issued May 25, 2010, which is incorporated by reference herein in its entirety. Furthermore, because extrusion may have low tooling costs, it may be relatively inexpensive when compared to other forming or manufacturing processes.

Figure 6:
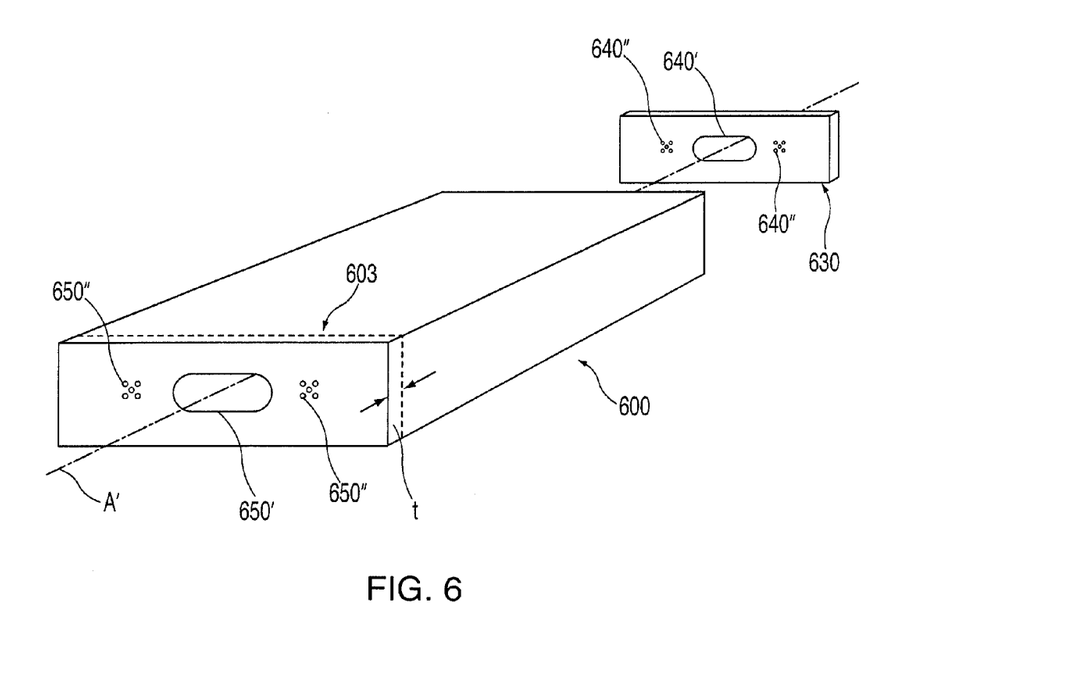
FIG. 6 is a diagram of a system for forming an extruded portion of an electronic device in accordance with some embodiments of the invention.

For example, as shown in FIG. 6, a block of material 600 may be extruded by being drawn through a die 630 of a desired shape along a longitudinal axis A'. Die 630 may be designed to include one or more extrusion elements 640 that may extrude one or more holes 650 through the length of block 600. In some embodiments, extrusion elements 640 may be of various sizes and patterns to create various holes 650 through block 600, such as a single extrusion element 640' that may create a single large oval hole 650' that may be visible to a user, as well as multiple sets of extrusion elements 640" that may create multiple sets of small circular holes 650" that may be invisible to a user's naked eye.

Once block 600 has been extruded by die 630, one or more extruded portions 603 may be removed from block 600 and may be provided as a portion of an electronic device in accordance with the invention. For example, a portion 603 may be cut from block 600 substantially perpendicularly from axis A' to have a thickness t, as shown in FIG. 6. Therefore, more than one extruded portion 603 may be removed from block 600 and used to provide holes through an external surface portion of an electronic device in accordance with the invention.

Although extruded portion 103 has been described with respect to FIGS. 1-4 as an external portion provided in a cavity along a top wall of housing component 120 of housing 101, and although extruded portion 203 has been described with respect to FIGS. 1 and 5 as an external surface portion of a scroll wheel I/O component of electronic device 100, it is to be understood that extruded portion 603 may be any portion of or the entirety of any housing component or other external surface portion of electronic device 100. For example, as shown in FIG. 1, extruded portion 603 may be provided as the entire right side wall of housing 101 of electronic device 100.

Figure 7:
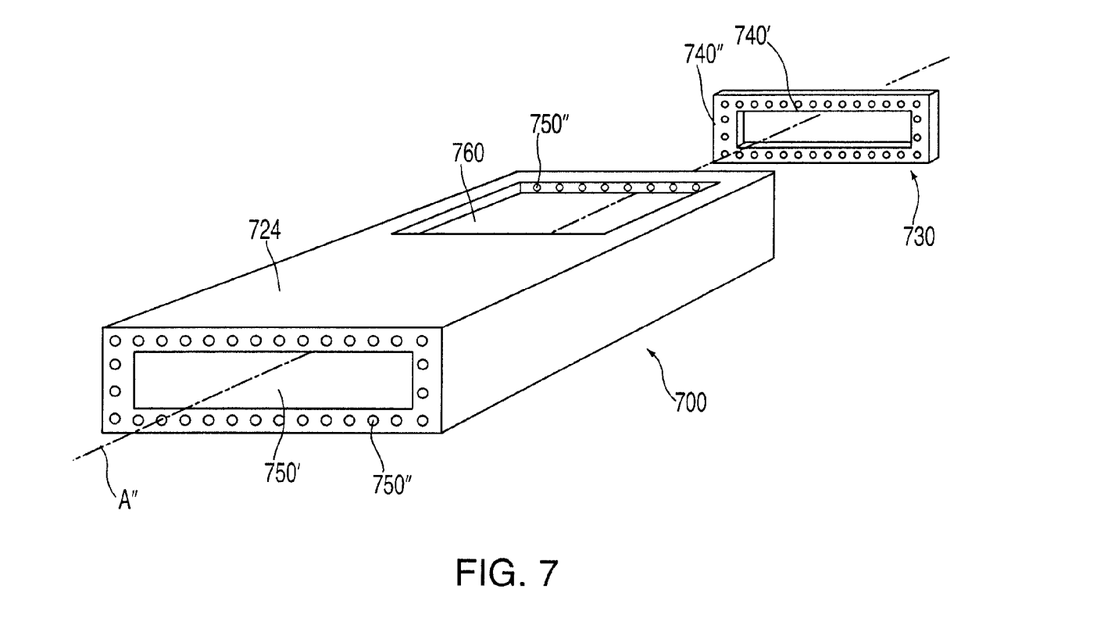
FIG. 7 is a diagram of a system for forming an extruded portion of an electronic device in accordance with some other embodiments of the invention.

In other embodiments, an extruded portion having one or more holes therethrough may be provided as multiple walls of a housing component of an electronic. For example, as shown in FIG. 7, a block of material 700 may be extruded by being drawn through a die 730 of a desired shape along a longitudinal axis A". Die 730 may be designed to include one or more extrusion elements 740 that may extrude one or more holes 750 through the length of block 700. In some embodiments, extrusion elements 740 may be of various sizes and patterns to create various holes 750 through block 700, such as a single extrusion element 740' that may create a single large rectangular hole 750', as well as multiple extrusion elements 740" that may create multiple smaller holes 750" about larger hole 750'.

In some embodiments, once block 700 has been extruded by die 730, one or more extruded portions may be removed from block 700 and may be provided as a portion of an electronic device in accordance with the invention. However, in other embodiments, as shown in FIG. 7, the entire extruded block 700 may be used to provide a hollow housing component with four sidewalls. For example, larger extruded hole 750' may provide a large hollow throughout extruded block 700, which may be used to contain one or more internal electronic components of an electronic device (e.g., electronic device 100). Therefore, a hole through an extruded electronic device portion of the invention may be used not only to pass information between an electronic component of an electronic device and an entity external to the device, but such an extruded hole may additionally or alternatively contain one or more components of an electronic device.

Moreover, in some embodiments, an opening 760 may be formed (e.g., machined) through one wall of extruded block 700, such as front wall 724. Opening 760 may be similar to the opening provided through housing 101 of electronic device 100 for exposing output device 197, for example. As shown in FIG. 7, opening 760 may also expose at least some of smaller extruded holes 750". In some embodiments, a smaller extruded hole 750" may, for example, be used to pass light or other information from one portion of an electronic device to another portion of the electronic device. For example, light may be passed from one end of block 700 and through a smaller extruded hole 750" into opening 760. If an electronic component, such as a display output component 197, is provided at least partially within opening 760, then the light carried by a smaller extruded hole 750" may be used to backlight the display output component, for example. Therefore, a hole through an extruded electronic device portion of the invention may be used not only to pass information between an electronic component of an electronic device and an entity external to the device, but may additionally or alternatively pass information (e.g., light) between various components of an electronic device (e.g., between a light source and a display output component).

Furthermore, in some embodiments, a smaller extruded hole 750" may, for example, be used to carry traces, wires, or other electronic components from one portion of an electronic device to another portion of the electronic device. For example, wires may run from one end of block 700, through a smaller extruded hole 750", and into opening 760. If an electronic component, such as a display output component 197, is provided at least partially within opening 760, then one or more wires may exit a smaller extruded hole 750" and may connect with the electronic component within opening 760. Therefore, a hole through an extruded electronic device portion of the invention may be used not only to pass information between an electronic component of an electronic device and an entity external to the device, but may additionally or alternatively house and carry a first electronic component (e.g., wires) between various other components of an electronic device (e.g., a power source and a display output component).

Figure 8:
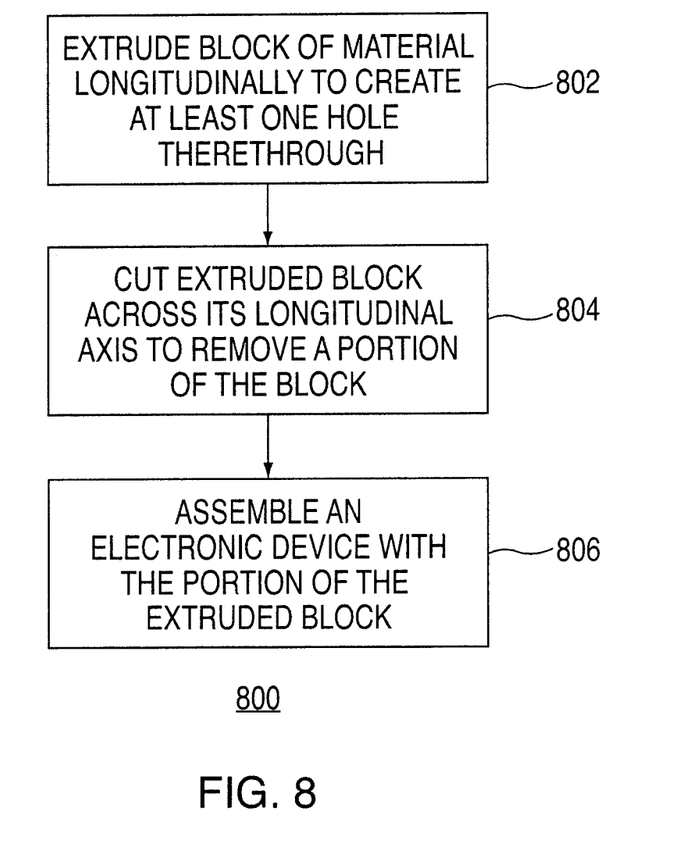
FIG. 8 is a flowchart of an illustrative process for forming a portion of an electronic device in accordance with some embodiments of the invention.

FIG. 8 shows an illustrative process for extruding a portion of material for use with an electronic device in accordance with the invention. Process 800 of FIG. 8 may begin by extruding a block of material (e.g., longitudinally) to create at least one hole therethrough at step 802. The size, shape, and/or pattern of each of the one or more holes created at step 802 may be based on the functionality of the extruded portion with respect to the electronic device (e.g., based on the type of I/O component to be provided adjacent the extruded portion for communicating information through the one or more holes of the extruded portion).

Next, at step 804, the extruded block may be cut to remove a portion of the block that includes at least a portion of at least one of the one or more holes, such that the portion of the at least one hole provides at least one passageway for information to be communicated therethrough. In some embodiments, the extruded block may be cut across its longitudinal axis perpendicularly to its longitudinal axis (see, e.g., FIG. 6). However, in other embodiments, the extruded block may be cut at any other suitable angle that provides a portion including at least a portion of at least one of the one or more holes created at step 802. The removed portion of the block may be any suitably sized portion of the block, such as a thin slice or a significant portion of the block. In other embodiments, step 804 may be unnecessary and the entire extruded block may be used going forward to step 806.

At step 806, a housing or other external surface portion of an electronic device may be assembled using the portion or the entirety of the extruded block. In some embodiments, the extruded portion may be provided in a cavity of a housing component of the electronic device. In other embodiments, the extruded portion may be positioned adjacent an outer surface of an electronic component of the electronic device. A portion of at least one hole through the extruded portion of the material may allow information to be communicated between an electronic component of the electronic device and a component external to the electronic device (e.g., sound from a user to a microphone component of the device or light to a user from a light source of the device).

In practice, one or more steps shown in illustrative process 800 may be combined with other steps, performed in any suitable order, performed in parallel (e.g., simultaneously or substantially simultaneously), or removed. For example, as mentioned, the entire extruded block of material may be used at step 806, thereby obviating the need for step 804. Moreover, additional processing steps may be performed on the extruded block portion before assembling the electronic device. For example, an entire extruded block or an extruded block portion may be forged, bent, drawn, deep drawn, annealed, etched, machined, or subjected to any other suitable processing step. For example, as shown, extruded portion 203 may be forged or bent (e.g., in the direction of arrow B of FIG. 5A) to provide a curved extruded portion 203' (see, e.g., FIG. 5B). One or more of the extruded holes 250 of extruded portion 230 may therefore span between curved surfaces of extruded material.

Figure 9A:
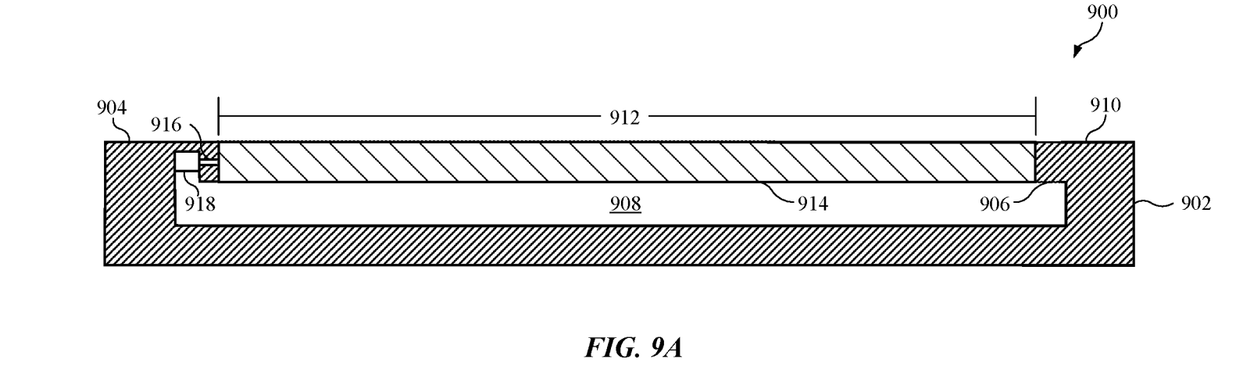
FIGS. 9A and 9B show cross-sectional views of electronic devices, in accordance with some embodiments.
Figure 9B:
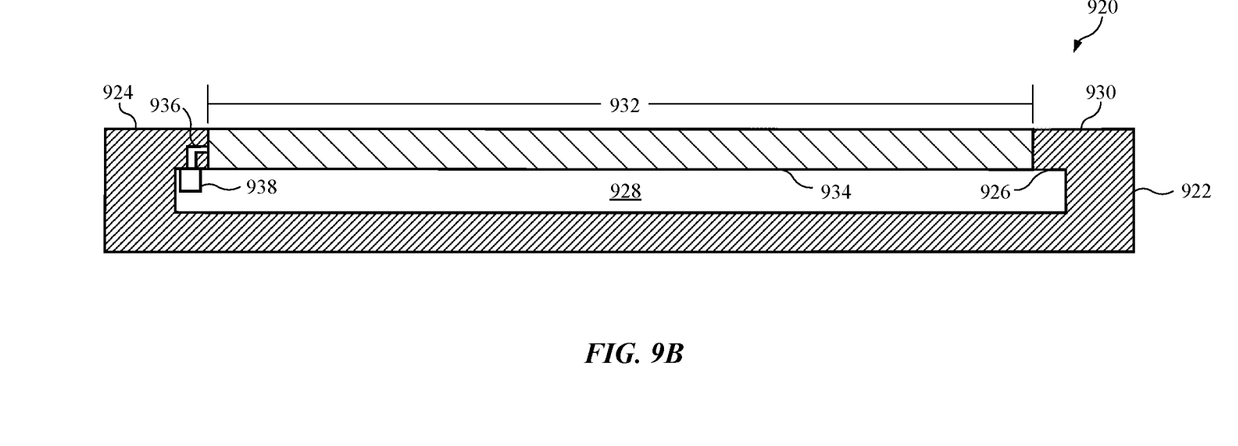

As described above, in some embodiments, holes within a housing can be used to pass information (e.g., light) between various components of an electronic device, such as between a light source and a display assembly of the electronic device. FIGS. 9A and 9B illustrate cross-section views of two such embodiments. FIG. 9A shows electronic device 900, which includes housing 902. Housing 902 includes wall 910, which can be defined by exterior surface 904 corresponding to an outer surface of electronic device 900 and interior surface 906 that defines cavity 908. Wall 910 can have opening 912 that passes through exterior surface 904 and interior surface 906. Opening 912 can be configured to accommodate electronic component 914 therein. In some embodiments, electronic component 914 is a display assembly. Hole 916 is positioned within wall 910. In some embodiments, hole 916 does not pass through exterior surface 904 of wall 910. As described above, the extrusion methods allow for hole 916 to be extruded through a material. Thus, hole 916 can be positioned within a solid piece of material of wall 910. This configuration allows light generated by light source 918 within cavity 918 to be conveyed through hole 916 to electronic component 914. For example, light from light source 918 can be conveyed in a first end of hole 916, through hole 916 within the wall 910, and out a second end proximate to electronic component 914. Thus, hole 916 can be referred to as a light tunnel. In some cases, the light from light source 918 can supply backlight to electronic component 914, for example, if electronic component 914 is a display assembly.

FIG. 9B shows an alternative configuration, in accordance with above-described embodiments. Electronic device 920 includes housing 922, which includes wall 930. Wall 930 can be defined by exterior surface 924 corresponding to an outer surface of electronic device 920 and interior surface 926 that defines cavity 928. Wall 930 can have opening 932 that passes through exterior surface 924 and interior surface 926. Opening 932 can be configured to accommodate electronic component 934 therein, which can correspond to a display assembly. Hole 936 is positioned within wall 930. In some embodiments, hole 936 does not pass through exterior surface 924 of wall 930. Hole 916 can be positioned within a solid piece of material of wall 930. Light generated by light source 938 within cavity 928 can be conveyed through hole 936 to electronic component 934. For example, light from light source 938 can be conveyed in a first end of hole 936, through hole 936 within the wall 930, and out a second end proximate to electronic component 934. Thus, hole 936 can be referred to as a light tunnel. In some cases, the light from light source 938 can supply backlight to electronic component 934, for example, if electronic component 934 is a display assembly. As shown, hole 936 can have a different shape than hole 916 of FIG. 9A. In some embodiments, at least a portion of hole 916 or hole 936 can have a generally parallel orientation with respect to exterior surface 924.

While there have been described apparatus and methods for providing holes through housing components and other external surface portions of electronic devices that are aesthetically pleasing, small, and easy to manufacture, it is to be understood that many changes may be made therein without departing from the spirit and scope of the invention. It is also to be understood that various directional and orientational terms such as "front" and "back" and "rear," "left" and "right," "top" and "bottom," "side" and "edge" and "corner," "height" and "width" and "depth," "thickness" and "diameter," and the like are used herein only for convenience, and that no fixed or absolute directional or orientational or geometrical limitations are intended by the use of these words. For example, the devices of this invention can have any desired orientation. If reoriented, different directional or orientational terms may need to be used in their description, but that will not alter their fundamental nature as within the scope and spirit of this invention. Those skilled in the art will appreciate that the invention can be practiced by other than the described embodiments, which are presented for purposes of illustration rather than of limitation, and the invention is limited only by the claims which follow.

As described above, in some embodiments, holes within a housing can be used to pass information (e.g., light) between various components of an electronic device, such as between a light source and a display assembly of the electronic device. FIGS. 9A and 9B illustrate cross-section views of two such embodiments. FIG. 9A shows electronic device 900, which includes housing 902. Housing 902 includes wall 910, which can be defined by exterior surface 904 corresponding to an outer surface of electronic device 900 and interior surface 906 that defines cavity 908. Wall 910 can have opening 912 that passes through exterior surface 904 and interior surface 906. Opening 912 can be configured to accommodate electronic component 914 therein. In some embodiments, electronic component 914 is a display assembly. Hole 916 is positioned within wall 910. In some embodiments, hole 916 does not pass through exterior surface 904 of wall 910. As described above, the extrusion methods allow for hole 916 to be extruded through a material. Thus, hole 916 can be positioned within a solid piece of material of wall 910. This configuration allows light generated by light source 918 within cavity 918 to be conveyed through hole 916 to electronic component 914. For example, light from light source 918 can be conveyed in a first end of hole 916, through hole 916 within the wall 910, and out a second end proximate to electronic component 914. Thus, hole 916 can be referred to as a light tunnel. In some cases, the light from light source 918 can supply backlight to electronic component 914, for example, if electronic component 914 is a display assembly.

FIG. 9B shows an alternative configuration, in accordance with above-described embodiments. Electronic device 920 includes housing 922, which includes wall 930. Wall 930 can be defined by exterior surface 924 corresponding to an outer surface of electronic device 920 and interior surface 926 that defines cavity 928. Wall 930 can have opening 932 that passes through exterior surface 924 and interior surface 926. Opening 932 can be configured to accommodate electronic component 934 therein, which can correspond to a display assembly. Hole 936 is positioned within wall 930. In some embodiments, hole 936 does not pass through exterior surface 924 of wall 930. Hole 916 can be positioned within a solid piece of material of wall 930. Light generated by light source 938 within cavity 928 can be conveyed through hole 936 to electronic component 934. For example, light from light source 938 can be conveyed in a first end of hole 936, through hole 936 within the wall 930, and out a second end proximate to electronic component 934. Thus, hole 936 can be referred to as a light tunnel. In some cases, the light from light source 938 can supply backlight to electronic component 934, for example, if electronic component 934 is a display assembly. As shown, hole 936 can have a different shape than hole 916 of FIG. 9A. In some embodiments, at least a portion of hole 916 or hole 936 can have a generally parallel orientation with respect to exterior surface 924.

What is claimed is:

1. A housing for an electronic device, comprising:
   a wall defined by an exterior surface corresponding to an outer surface of the housing and an interior surface defining a central cavity suitable for carrying a light source configured to generate light, wherein the wall includes:
   an opening suitable for positioning a display component therein, wherein the opening passes through the interior surface and the exterior surface; and
   a light tunnel disposed within a solid piece of material of the wall and having a cross-sectional area in a range of 175 square micrometers to 1600 square micrometers, the light tunnel having a first end proximate to the light source and a second end proximate to the display component within the opening, the light tunnel configured to convey light from the light source in the first end of the light tunnel, through the light tunnel within the wall, and out the second end proximate the display component in a manner suitable for supplying backlight for the display component.

2. The housing of claim 1, wherein the wall comprises a ceramic material.

3. The housing of claim 2, wherein the ceramic material is one of alumina, zirconia, or a combination of alumina and zirconia.

4. The housing of claim 1, wherein the wall comprises one of metal or plastic material.

5. The housing of claim 1, wherein the housing further comprises a wire hole disposed within the solid piece of material of the wall, the wire hole configured to accommodate a wire for transferring power generated by a power source within the central cavity through the wire hole and to the display component.

6. The housing of claim 1, wherein the opening has at least one edge suitable for securing the display component to the wall.

7. The housing of claim 1, wherein the light tunnel is defined by internal sides, wherein at least a portion of the internal sides are substantially parallel with respect to the exterior surface of the wall.

8. The housing of claim 1, wherein the cross-sectional area of the light tunnel is in the range of 300 square micrometers to 1250 square micrometers.

9. The housing of claim 1, wherein the light tunnel has a tapered geometry.

10. A housing for an electronic device, comprising:
a main body suitable for accommodating a light source configured to generate light, the main body having a wall defined by an exterior surface corresponding to an outer surface of the main body and an interior surface defining an internal cavity of the main body, the wall comprising:
an opening that passes through the interior surface and the exterior surface, the opening suitable for positioning a display assembly therein; and
a hole within a solid piece of material of the wall and having a cross-sectional area in a range of 175 square micrometers to 1600 square micrometers, wherein the hole has a first end proximate to the light source and a second end proximate to the display assembly, wherein the hole is configured to convey light generated by the light source in the first end of the hole, through the hole within the wall, and out the second end of the hole proximate to the display assembly, thereby supplying backlight for the display assembly.

11. The housing of claim 10, wherein the hole does not pass through the exterior surface of the wall.

12. The housing of claim 10, wherein the main body includes a plurality of holes within the solid piece of material of the wall.

13. The housing of claim 10, wherein the wall comprises a ceramic material.

14. The housing of claim 10, wherein the wall comprises metallic material.

15. A portable electronic device, comprising:
a housing configured to accommodate a light source and a display component, the housing comprising a wall having an exterior surface corresponding to an outer surface of portable electronic device and an interior surface defining an internal cavity, the wall comprising:
an opening that passes through the interior surface and the exterior surface, and
a hole disposed within a solid piece of material of the wall and having a cross-sectional area in a range of 175 square micrometers to 1600 square micrometers, wherein the hole does not pass through the exterior surface;
the display component within the opening of the wall; and
a light source within the internal cavity of the housing, wherein the hole has a first end proximate to the light source and a second end proximate to the display component, wherein the hole is configured to convey light generated by the light source in the first end of the hole, through the hole within the wall, and out the second end of the hole proximate to the display component so as to supply backlight for the display component.

16. The portable electronic device of claim 15, wherein at least a portion of the hole has a parallel orientation with respect to the exterior surface of the wall.

17. The portable electronic device of claim 15, wherein a cross-sectional area of the hole is in the range of 300 square micrometers to 1250 square micrometers.

18. The portable electronic device of claim 15, wherein the wall includes a number of holes within the solid piece of material.

19. The portable electronic device of claim 18, wherein each hole is configured to convey light generated by the light source through the hole to supply backlight for the display component.

20. The portable electronic device of claim 18, wherein at least one of the number of holes is configured to pass a wire therethrough between an electronic component housed within the internal cavity and the display component.

* * * * *